(12) United States Patent
Tanaka

(10) Patent No.: US 10,505,557 B2
(45) Date of Patent: Dec. 10, 2019

(54) ANALOG-TO-DIGITAL CONVERTER, ELECTRONIC DEVICE, AND METHOD OF CONTROLLING ANALOG-TO-DIGITAL CONVERTER

(71) Applicant: SONY CORPORATION, Tokyo (JP)

(72) Inventor: Sachiya Tanaka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/077,003

(22) PCT Filed: Dec. 8, 2016

(86) PCT No.: PCT/JP2016/086551
§ 371 (c)(1),
(2) Date: Aug. 9, 2018

(87) PCT Pub. No.: WO2017/145494
PCT Pub. Date: Aug. 31, 2017

(65) Prior Publication Data
US 2019/0036538 A1    Jan. 31, 2019

(30) Foreign Application Priority Data
Feb. 25, 2016  (JP) ................. 2016-033930

(51) Int. Cl.
*H03M 1/00* (2006.01)
*H03M 1/38* (2006.01)

(52) U.S. Cl.
CPC ............. *H03M 1/002* (2013.01); *H03M 1/38* (2013.01)

(58) Field of Classification Search
CPC .......... H03M 1/38; H03M 1/002; H03M 1/12; H03M 1/462
(Continued)

(56) References Cited

U.S. PATENT DOCUMENTS 4,349,883 A * 9/1982 Doljack ................. B65G 43/02
                                                    198/810.02
4,562,464 A * 12/1985 Kurihara ................. H04N 5/32
                                                    348/E5.086
(Continued)

FOREIGN PATENT DOCUMENTS

JP    03-159320 A    7/1991
JP    05-335958 A    12/1993
(Continued)

OTHER PUBLICATIONS

International Search Report and Written Opinion of PCT Application No. PCT/JP2016/086551, dated Feb. 28, 2017, 09 pages of ISRWO.

*Primary Examiner* — Lam T Mai
(74) *Attorney, Agent, or Firm* — Chip Law Group

(57) ABSTRACT

To reduce power consumption of a sequential comparison analog-to-digital converter. An analog-to-digital converter includes a sequential conversion unit, a determination unit, and a stop control unit. The sequential conversion unit sequentially generates a predetermined number of bits of a value corresponding to an analog signal when the analog signal is input. The determination unit determines whether a value of a digital signal including the predetermined number of bits is within a predetermined range whenever the bits are generated. The stop control unit stops the sequential conversion unit in a case in which the value of the digital signal is not within the predetermined range.

9 Claims, 18 Drawing Sheets

(58) Field of Classification Search
USPC .................................................. 341/140–165
See application file for complete search history.

(56) References Cited

U.S. PATENT DOCUMENTS

| | | | | |
|---|---|---|---|---|
| 5,493,868 A * | 2/1996 | Kikuiri | ................... | H02P 4/00 |
| | | | | 318/807 |
| 7,065,966 B2 * | 6/2006 | Yamada | .................. | F02B 37/24 |
| | | | | 250/231.13 |
| 2006/0182002 A1 * | 8/2006 | Ryu | ....................... | G11B 20/10 |
| | | | | 369/124.01 |
| 2008/0007439 A1 * | 1/2008 | Hirose | ................ | H03M 1/1071 |
| | | | | 341/120 |
| 2009/0009373 A1 | 1/2009 | Yoshinaga | | |
| 2016/0111042 A1 * | 4/2016 | Pyeon | ................. | G09G 3/3208 |
| | | | | 345/212 |
| 2017/0184519 A1 * | 6/2017 | Sako | ................... | G01N 23/223 |

FOREIGN PATENT DOCUMENTS

| | | | |
|---|---|---|---|
| JP | 5-335958 A | 12/1993 | |
| JP | 2000-049609 A | 2/2000 | |
| JP | 2000-49609 A | 2/2000 | |
| JP | 2009-017085 A | 1/2009 | |
| JP | 2012-253717 A | 12/2012 | |

* cited by examiner

FIG. 3

| START SIGNAL SOC | BITS COMP | OPERATION OF AD CONVERSION DATA REGISTER |
|---|---|---|
| 1 | 0/1 | RESET TO INITIAL VALUE |
| 0 | 0 | UPDATE BIT INDICATED BY DIGIT CONTROL SIGNAL MAG TO "0" |
| 0 | 1 | UPDATE BIT INDICATED BY DIGIT CONTROL SIGNAL MAG TO "1" |

FIG. 4

| THRESHOLD AND DIGITAL SIGNAL | DETERMINATION RESULT DEC |
|---|---|
| BIT STRING FROM MSB TO n-TH BIT OF THRESHOLD IS IDENTICAL TO BIT STRING FROM MSB TO n-TH BIT OF DIGITAL SIGNAL | 11 (=) |
| BIT STRING FROM MSB TO n-TH BIT OF DIGITAL SIGNAL IS GREATER THAN BIT STRING FROM MSB TO n-TH BIT OF THRESHOLD | 01 (DIGITAL SIGNAL > THRESHOLD) |
| BIT STRING FROM MSB TO n-TH BIT OF DIGITAL SIGNAL IS LESS THAN BIT STRING FROM MSB TO n-TH BIT OF THRESHOLD | 10 (DIGITAL SIGNAL < THRESHOLD) |

FIG. 6

| START SIGNAL SOC | DETERMINATION RESULT DEC | OPERATION OF EOC GENERATION UNIT |
|---|---|---|
| 1 | 00, 01, 10, 11 | INTERNAL FLAG ← 0<br>CNT ← 1 |
| 0 | 11<br>(THRESHOLD = DIGITAL SIGNAL) | DIGIT IS CONTROLLED, CNT IS COUNTED UP, AND EOC IS GENERATED WHEN CNT IS 9 |
| 0 | 01<br>(THRESHOLD > DIGITAL SIGNAL) | |
| 0 | 10<br>(THRESHOLD < DIGITAL SIGNAL) | DIGIT IS CONTROLLED, CNT IS COUNTED UP, AND EOC IS GENERATED WHEN INTERNAL FLAG IS 0 OR CNT IS 9 |

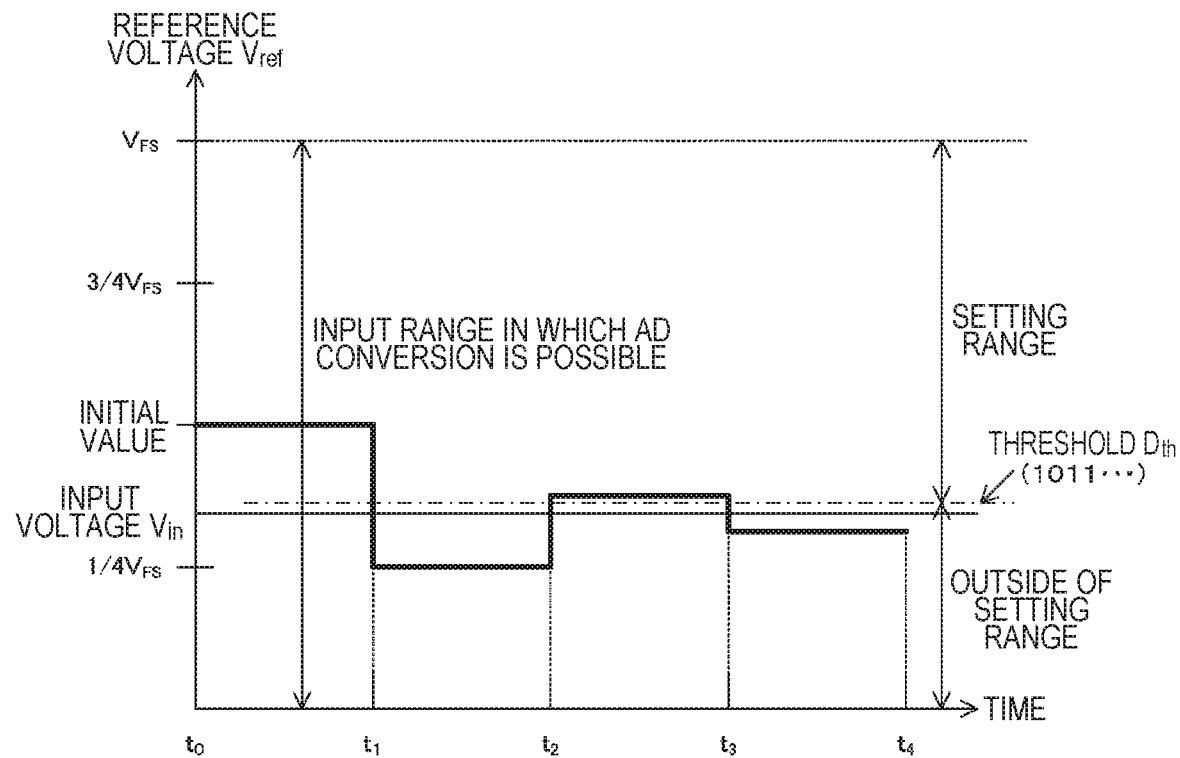
FIG. 7A
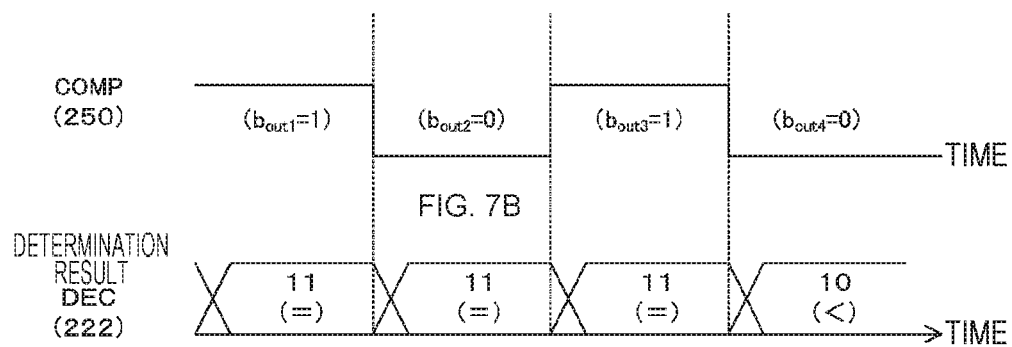
FIG. 7B
FIG. 7C

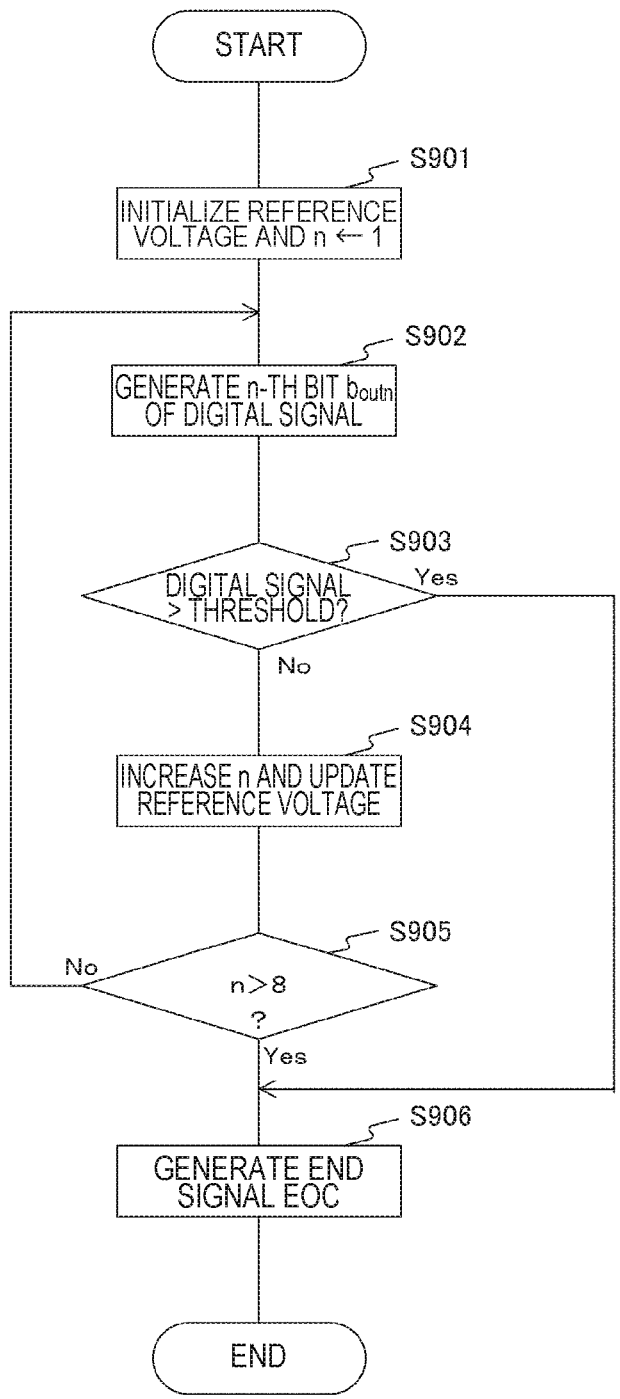

THRESHOLD REGISTER
(THRESHOLD = 199d)

MSB | | | | | | | LSB
--- | --- | --- | --- | --- | --- | --- | ---
1 | 1 | 0 | 0 | 0 | 1 | 1 | 1
128 | 64 | | | | 4 | 2 | 1

FIG. 12A

AD CONVERSION DATA REGISTER
(INITIAL VALUE)

MSB | | | | | | | LSB
--- | --- | --- | --- | --- | --- | --- | ---
0 | 0 | 0 | 0 | 0 | 0 | 0 | 0

FIG. 12B

AD CONVERSION OF FIRST BIT

AD CONVERSION DATA REGISTER
(MSB UPDATING : 128 + ?)

MSB | | | | | | | LSB
--- | --- | --- | --- | --- | --- | --- | ---
1 | 0 | 0 | 0 | 0 | 0 | 0 | 0
128 | | | | | | |

FIG. 12C

MSBS ARE IDENTICAL TO EACH OTHER

AD CONVERSION OF SECOND BIT

AD CONVERSION DATA REGISTER
(SECOND BIT UPDATING : 128+64+?<199)

MSB | | | | | | | LSB
--- | --- | --- | --- | --- | --- | --- | ---
1 | 1 | 0 | 0 | 0 | 0 | 0 | 0
128 | 64 | | | | | |

FIG. 12D

DETERMINED TO BE EQUAL TO OR LESS THAN THRESHOLD IN LSB
$b_{out2} < b_{th2}$

IDENTICAL UP TO SEVENTH BIT
AD CONVERSION DATA REGISTER
(LSB UPDATING : 128+64+4+2<199)

MSB | | | | | | | LSB
--- | --- | --- | --- | --- | --- | --- | ---
1 | 1 | 0 | 0 | 0 | 1 | 1 | 0
128 | 64 | | | | 4 | 2 |

END SIGNAL EOC

FIG. 12E

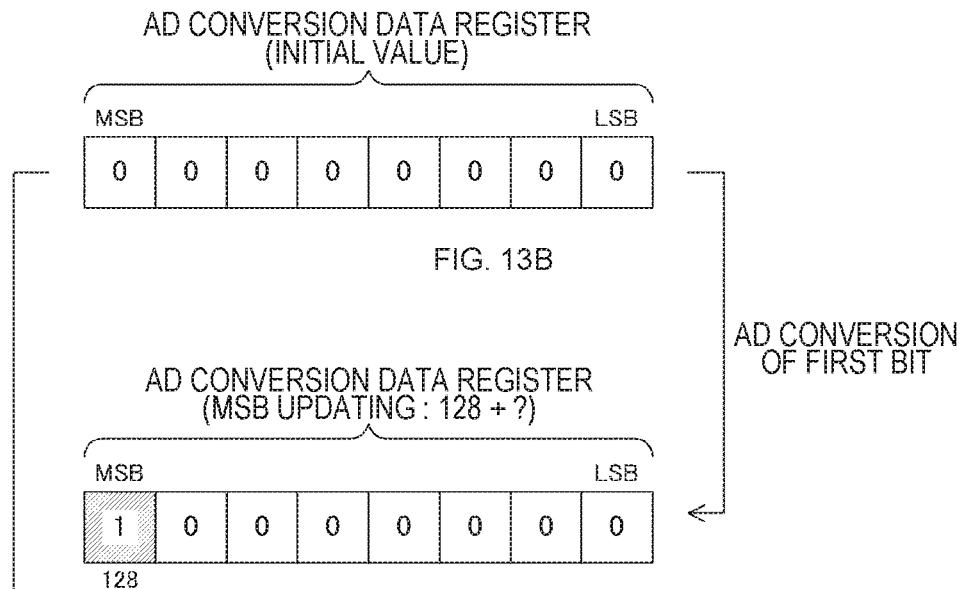
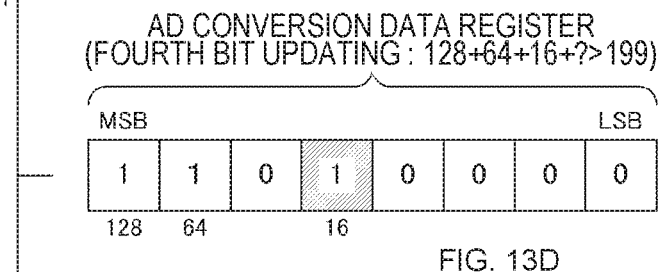
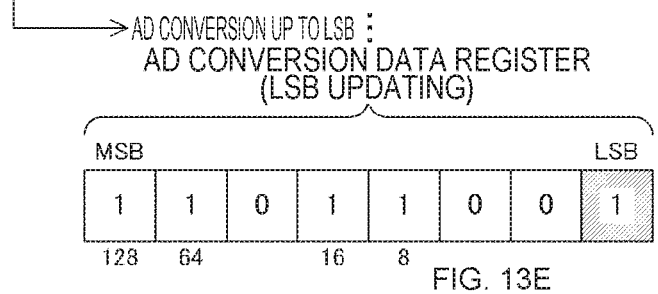

FIG. 15

| MODE SIGNAL MODE | OPERATION OF OUTPUT CONTROL UNIT |
|---|---|
| 1 (CONDITION DETERMINATION OUTPUT MODE) | OUTPUT EOC AND DETERMINATION RESULT IN CASE IN WHICH DIGITAL SIGNAL IS WITHIN SETTING RANGE |
| 0 (DETERMINATION RESULT OUTPUT MODE) | OUTPUT DETERMINATION RESULT ALONG WITH EOC |

ANALOG-TO-DIGITAL CONVERTER, ELECTRONIC DEVICE, AND METHOD OF CONTROLLING ANALOG-TO-DIGITAL CONVERTER

CROSS REFERENCE TO RELATED APPLICATIONS

This application is a U.S. National Phase of International Patent Application No. PCT/JP2016/086551 filed on Dec. 8, 2016, which claims priority benefit of Japanese Patent Application No. JP 2016-033930filed in the Japan Patent Office on Feb. 25, 2016. Each of the above-referenced applications is hereby incorporated herein by reference in its entirety.

TECHNICAL FIELD

The present technology relates to an analog-to-digital converter, an electronic device, and a method of controlling the analog-to-digital converter. Specifically, the present technology relates to a sequential comparison analog-to-digital converter, an electronic device, and a method of controlling the analog-to-digital converter.

BACKGROUND ART

In the related art, in various electronic devices performing measurement or wireless communication, analog-to-digital converters (ADCs) are installed to convert analog signals from sensors or antennas into digital signals. There are various kinds of ADCs, and sequential comparison ADCs are widely used because of their low power consumption and small circuit scales.

The sequential comparison ADC generally includes a comparator that compares a sampled analog signal to a reference voltage, a reference voltage generation circuit that generates the reference voltage, and a control circuit that controls the reference voltage in accordance with an output of the comparator (for example, see Patent Literature 1). In this configuration, the analog signal is converted into a digital signal with a plurality of bits and the bits are generated in order.

CITATION LIST

Patent Literature

Patent Literature 1: JP H3-159320A

DISCLOSURE OF INVENTION

Technical Problem

In the above-described technology of the related art, bits are generated sequentially. Therefore, as the number of bits of a digital signal is larger, a time taken from the start of sampling to the end of AD conversion is longer. Thus, power consumption may increase. When a sampling rate is decreased, power consumption per unit time can be reduced. However, it is not preferable to decrease the sampling rate since a data rate of a digital signal is decreased. In this way, there is a problem that it is difficult to reduce power consumption of an analog-to-digital converter while maintaining a sampling rate.

The present technology is devised in view of such circumstances and an object of the present technology is to reduce power consumption of a sequential comparison analog-to-digital converter.

Solution to Problem

The present technology is made in view of the above problem. A first aspect of the present technology is an analog-to-digital converter and a method of controlling the analog-to-digital converter, the analog-to-digital converter including: a sequential conversion unit configured to sequentially generate a predetermined number of bits of a value corresponding to an analog signal when the analog signal is input; a determination unit configured to determine whether a value of a digital signal including the predetermined number of bits is within a predetermined range whenever the bits are generated; and a stop control unit configured to stop the sequential conversion unit in a case in which the value of the digital signal is not within the predetermined range. Thus, it is possible to obtain an operational effect of stopping generation of bits in a case in which the value of the digital signal is not within the predetermined range.

In addition, in the first aspect, the sequential conversion unit may include a comparator configured to compare the analog signal to a reference signal and generate the bits on a basis of a result of the comparison, and a reference signal control unit configured to update a value of the reference signal whenever the bits are generated. Thus, it is possible to obtain an operational effect of updating the value of the reference signal whenever the bits are generated.

In addition, in the first aspect, an output control unit configured to output a determination result obtained by determining whether the value of the digital signal is within the predetermined range may be further included. Thus, it is possible to obtain an operational effect of outputting the determination result obtained by determining whether the value of the digital signal is within the predetermined range.

In addition, in the first aspect, the output control unit may output the determination result in a case in which the value of the digital signal is within the predetermined range. Thus, it is possible to obtain an operational effect of outputting the determination result obtained by determining that the value of the digital signal is within the predetermined range.

In addition, in the first aspect, a threshold holding unit configured to hold a threshold of a binary number indicating a boundary of the predetermined range may be further included. The determination unit may determine whether the value of the digital signal is within the predetermined range on a basis of the threshold. Thus, it is possible to obtain an operational effect of determining whether the value of the digital signal is within the predetermined range on a basis of the threshold.

In addition, in the first aspect, the determination unit may compare a value up to digits corresponding to the generated bits of the threshold to a value up to the generated bits of the digital signal. Thus, it is possible to obtain an operational effect of comparing the value up to the digits corresponding to the generated bits of the threshold to the value up to the generated bits of the digital signal.

In addition, in the first aspect, the stop control unit may generate a predetermined end signal in a case in which the value of the digital signal is not within the predetermined range or a case in which the predetermined number of bits are output, and the reference signal control unit may stop a process of changing a value of the reference signal in accordance with the predetermined end signal. Thus, it is possible to obtain an operational effect of generating the end signal in the case in which the value of the digital signal is not within the predetermined range or the predetermined number of bits are output.

In addition, a second aspect of the present technology is an electronic device including: a sequential conversion unit configured to sequentially generate a predetermined number of bits of a value corresponding to an analog signal when the analog signal is input; a determination unit configured to determine whether a value of a digital signal including the predetermined number of bits is within a predetermined range whenever the bits are generated; a stop control unit configured to stop the sequential conversion unit in a case in which the value of the digital signal is not within the predetermined range; and a digital signal processing unit configured to process the digital signal. Thus, it is possible to obtain an operational effect of processing the digital signal and stopping generation of the bits in the case in which the value of the digital signal is not within the predetermined range.

Advantageous Effects of Invention

According to the present technology, it is possible to obtain the excellent advantageous effect of enabling power consumption of the sequential comparison analog-to-digital converter to be reduced. Note that effects described herein are not necessarily limitative, and any effect that is desired to be described in the present disclosure may be admitted.

BRIEF DESCRIPTION OF DRAWINGS

FIG. 3 is a diagram illustrating an example of an operation of an AD conversion data register according to the first embodiment of the present technology.

FIG. 4 is a diagram illustrating an example of an operation of a threshold determination unit according to the first embodiment of the present technology.

FIG. 6 is a diagram illustrating an example of an operation of an EOC generation unit according to the first embodiment of the present technology.

FIGS. 7A, 7B and 7C are diagrams illustrating an example of a variation in a reference voltage, bits COMP, and a determination result DEC according to the first embodiment of the present technology.

FIG. 10 is a flowchart illustrating an example of an operation of the analog-to-digital converter according to the first embodiment of the present technology.

FIGS. 12A, 12B, 12C, 12D, and 12E are explanatory diagrams illustrating an operation in a case in which AD conversion is performed up to the end bit of a signal outside of a setting range according to the first embodiment of the present technology.

FIGS. 13A, 13B, 13C, 13D, and 13E are explanatory diagrams illustrating an operation in a case in which AD conversion is performed up to the end bit of a signal within the setting range according to the first embodiment of the present technology.

FIG. 15 is a diagram illustrating an example of an operation of an output control unit according to the second embodiment of the present technology.

MODE(S) FOR CARRYING OUT THE INVENTION

Hereinafter, modes for carrying out the present technology (hereinafter referred to as embodiments) will be described. The description will be made in the following order.

1. First embodiment (example in which AD conversion is stopped when digital signal is outside of setting range)
2. Second embodiment (example in which AD conversion is stopped and determination result is output when digital signal is outside of setting range)
3. Third embodiment (example in which external circuit of analog-to-digital converter stops AD conversion when digital signal is outside of setting range)

<1. First Embodiment>
[Configuration Example of Electronic Device]

Figure 1:
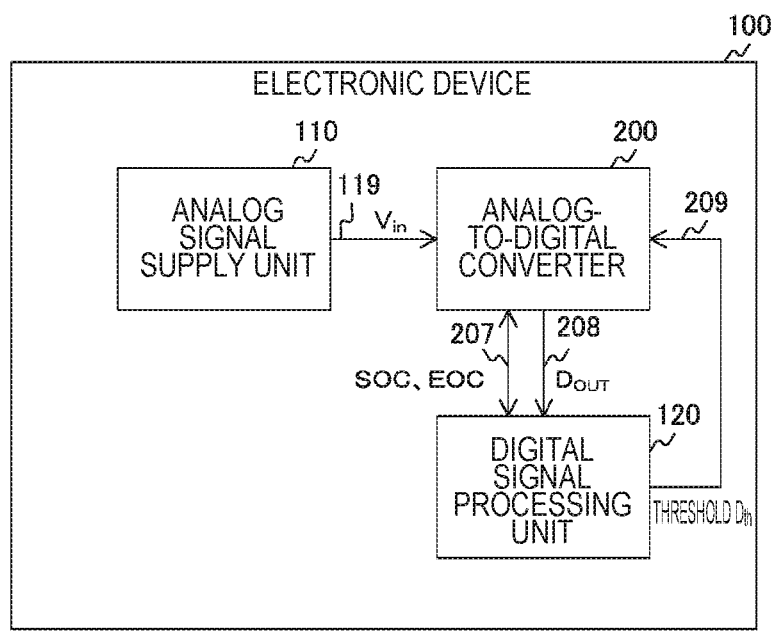
FIG. 1 is a block diagram illustrating a configuration example of an electronic device according to a first embodiment of the present technology.

FIG. 1 is a block diagram illustrating a configuration example of an electronic device 100 according to a first embodiment of the present technology. The electronic device 100 is a device that processes a digital signal and is assumed to be, for example, an environment monitor device or a digital health device. The electronic device 100 includes an analog signal supply unit 110, an analog-to-digital converter 200, and a digital signal processing unit 120.

The analog signal supply unit 110 supplies an analog input voltage $V_{in}$ to the analog-to-digital converter 200 via a signal line 119. As the analog signal supply unit 110, for example, a temperature sensor, a humidity sensor, or a pressure sensor is assumed. Note that the analog signal supply unit 110 may supply a current as an analog signal instead of a voltage.

The analog-to-digital converter 200 converts the analog input voltage $V_{in}$ into a digital signal $D_{out}$. In the analog-to-digital converter 200, a threshold $D_{th}$ is set in advance by the digital signal processing unit 120. The threshold indicates an upper limit or a lower limit of a setting range which is a range of signals which are processing targets of the digital signal processing unit 120. The setting range is set in accordance with characteristics of the analog signal supply unit 110 or content processed by the digital signal processing unit 120. For example, in a case in which the analog signal supply unit 110 is used as a sensor and a signal with a level equal to or less than a certain lower limit is excluded as an abnormal value of a processing target because of characteristics of the sensor, a range exceeding the lower limit is set as the setting range.

The analog-to-digital converter 200 starts AD conversion when a start signal SOC (Start Of Conversion) is input. Then, when the AD conversion ends, the analog-to-digital converter 200 supplies an end signal EOC (End Of Conversion) to the digital signal processing unit 120 via a signal line 207. In addition, the analog-to-digital converter 200 supplies the digital signal $D_{out}$ to the digital signal processing unit 120 via a signal line 208.

The digital signal processing unit 120 performs a predetermined process on the digital signal $D_{out}$ within the setting range. Conversely, the digital signal $D_{out}$ outside of the setting range is discarded. The process to be performed is environment monitoring or the like with a measured value of a temperature sensor, a humidity sensor, or a pressure sensor.

The digital signal processing unit 120 sets the threshold $D_{th}$ and a determination condition indicating whether the threshold is the upper limit or the lower limit before transmission of the start signal SOC and transmits the threshold $D_{th}$ and the determination condition to the analog-to-digital converter 200 via the signal line 209. Then, the digital signal processing unit 120 generates the start signal SOC whenever a given sampling period passes and supplies the start signal SOC to the analog-to-digital converter 200 via the signal line 207. Then, the digital signal processing unit 120 takes the digital signal $D_{out}$ in synchronization with the end signal EOC and processes the digital signal $D_{out}$.

Note that the digital signal processing unit 120 can change a sampling rate. For example, in a power saving mode or the like in which power consumption is lowered, the digital signal processing unit 120 reduces the sampling rate.

[Configuration Example of Analog-to-Digital Converter]

Figure 2:
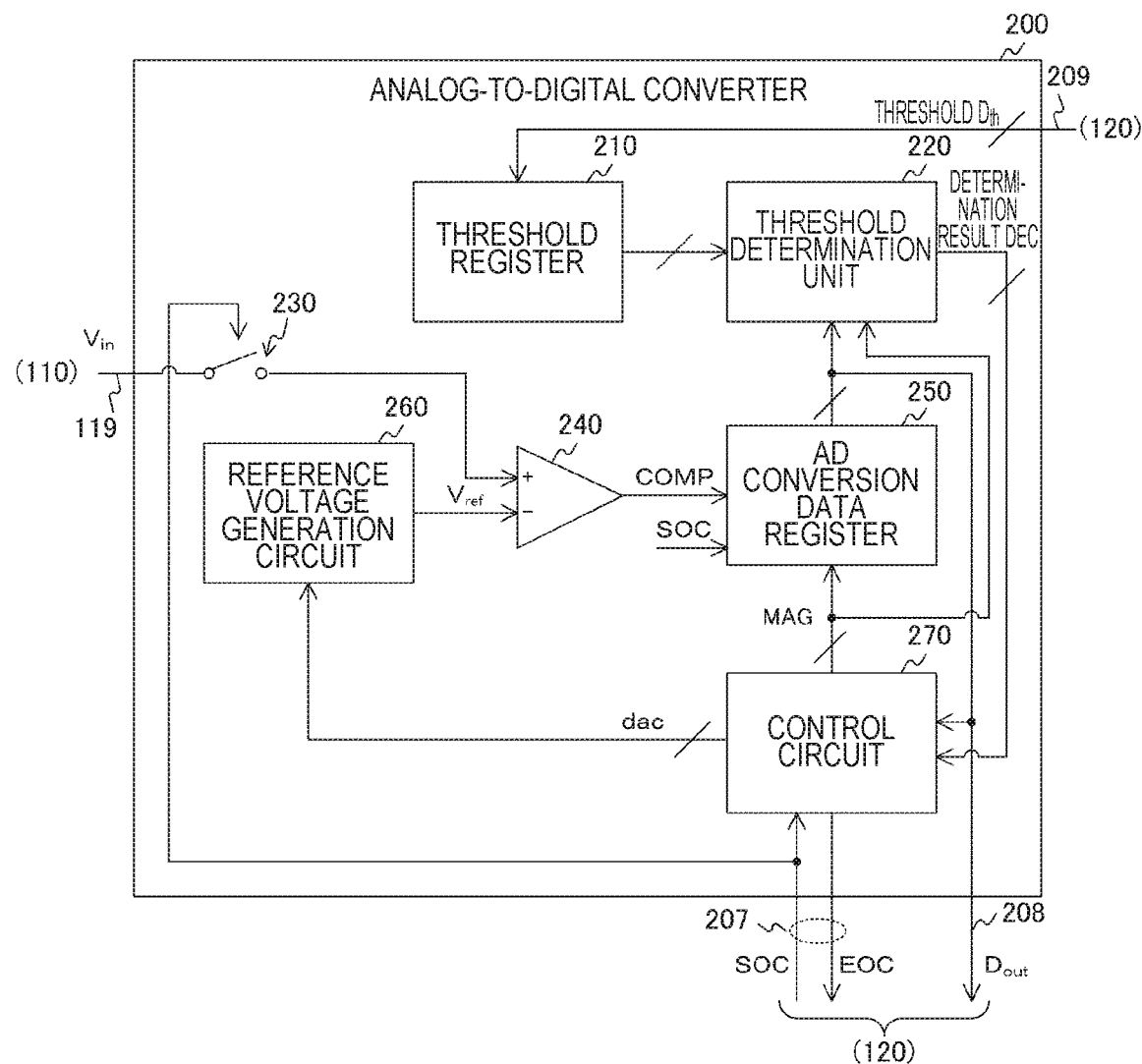
FIG. 2 is a block diagram illustrating a configuration example of an analog-to-digital converter according to the first embodiment of the present technology.

FIG. 2 is a block diagram illustrating a configuration example of the analog-to-digital converter 200 according to the first embodiment. The analog-to-digital converter 200 includes a threshold register 210, a threshold determination unit 220, a sampling switch 230, a comparator 240, an AD conversion data register 250, a reference voltage generation circuit 260, and a control circuit 270.

The sampling switch 230 opens and closes a path between the analog signal supply unit 110 and a non-inversion input terminal (+) of the comparator 240 in accordance with the start signal SOC. The sampling switch 230 is switched to a closed state when the start signal OSC is input, and is switched to an open state otherwise. The input voltage $V_{in}$ taken by the sampling switch 230 is held over a sampling period by a hold circuit or the like. Note that, in FIG. 2, the hold circuit is omitted.

The reference voltage generation circuit 260 generates a reference voltage $V_{ref}$ in accordance with a voltage control signal dac. The reference voltage generation circuit 260 supplies the generated reference voltage $V_{ref}$ to an inversion input terminal (−) of the comparator 240. For example, a digital-to-analog converter (DAC) is used as the reference voltage generation circuit 260.

The comparator 240 compares the input voltage $V_{in}$ to the reference voltage $V_{ref}$. The comparator 240 supplies bits COMP indicating a comparison result to the AD conversion data register 250.

The AD conversion data register 250 holds the digital signal $D_{out}$ including N (where N is an integer) bits COMP. When the start signal SOC is input, the AD conversion data register 250 resets all the held N (for example, "8") bits to an initial value (for example, a logical value "0"). In addition, when the bits COMP are input, the AD conversion data register 250 updates a bit indicated by a digit control signal MAG among the N held bits in accordance with the bits COMP. Here, the digit control signal MAG is a signal indicating a bit of the updated digit. Then, the AD conversion data register 250 supplies the digital signal $D_{out}$ to the threshold determination unit 220, the control circuit 270, and the digital signal processing unit 120.

The threshold register 210 holds the threshold $D_{th}$ of N digits expressed with a binary number and the determination condition indicating that the threshold is one of the upper limit and the lower limit. On the basis of the threshold $D_{th}$, the threshold determination unit 220 determines whether a value of the digital signal $D_{out}$ is within the setting range. The threshold determination unit 220 generates the determination result DEC and supplies the determination result DEC to the control circuit 270. Note that the threshold register 210 is an example of a threshold holding unit described in the claims. In addition, the threshold determination unit 220 is an example of a determination unit described in the claims.

The control circuit 270 controls the whole analog-to-digital converter 200. The control circuit 270 generates the voltage control signal dac on the basis of the digital signal $D_{out}$ and supplies the voltage control signal dac to the reference voltage generation circuit 260. In addition, whenever the bits COMP are output, the control circuit 270 generates the digit control signal MAG obtained by shifting an updating target digit by one digit from the previous digit and supplies the digit control signal MAG to the AD conversion data register 250 and the threshold determination unit 220.

In addition, in a case in which the value of the digital signal $D_{out}$ is not within the setting range or a case in which the N-th bit COMP is output, the end signal EOC is generated and supplied to the digital signal processing unit 120. Then, at the time of the generation of the end signal EOC, the control circuit 270 stops outputting the voltage control signal dac and the digit control signal MAG. Thus, the AD conversion by the analog-to-digital converter 200 is stopped.

Note that the control circuit 270 updates the voltage control signal dac and the digit control signal MAG whenever the bits COMP are output, but these control signals may also be updated in synchronization with an external clock signal from the outside of the analog-to-digital converter 200. An analog-to-digital converter that does not use an external clock signal is called a self-synchronization ADC and an analog-to-digital converter that uses an external clock signal is called an external synchronization ADC. In the external synchronization ADC, the threshold determination unit 220, the AD conversion data register 250, and the reference voltage generation circuit 260 operate in synchronization with an external clock signal. Then, the control circuit 270 stops the AD conversion by generating the end signal EOC and simultaneously stopping supply of the external clock signal to the threshold determination unit 220 and the like.

FIG. 3 is a diagram illustrating an example of an operation of the AD conversion data register 250 according to the first embodiment. In a case in which the start signal SOC is at a high level, the AD conversion data register 250 resets all the bits to an initial value. In addition, in a case in which the start signal SOC is at a low level, the AD conversion data register 250 updates the bit indicated by the digit control signal MAG to the value of the bits COMP.

FIG. 4 is a diagram illustrating an example of an operation of the threshold determination unit 220 according to the first embodiment. The threshold determination unit 220 compares a bit string from the MSB of the threshold $D_{th}$ to the n-th bit indicated by the digit control signal MAG to a bit string from the MSB to the n-th bit of the digital signal $D_{out}$. In a case in which the bit string from the MSB to the n-th bit of the threshold $D_{th}$ is identical to the bit string from the MSB to the n-th bit of the digital signal $D_{out}$, the threshold determination unit 220 generates a determination result DEC of the binary number "11" indicating "=."

In addition, in a case in which a value of the bit string from the MSB to the n-th bit of the digital signal $D_{out}$ is greater than a value of the bit string from the MSB to the n-th bit of the threshold $D_{th}$, the threshold determination unit 220 generates a determination result DEC of the binary number "01" indicating ">."

Conversely, in a case in which the value of the bit string from the MSB to the n-th bit of the digital signal $D_{out}$ is less than the value of the bit string from the MSB to the n-th bit of the threshold $D_{th}$, the threshold determination unit 220 generates a determination result DEC of the binary number "10" indicating "<."

For example, the threshold $D_{th}$ is assumed to be the binary number "11000111." In addition, the digital signal $D_{out}$ is assumed to be "111000000." In this case, the threshold determination unit 220 generates the determination result DEC indicating "=" up to the second bit of the digital signal $D_{out}$ is generated. Then, when the third bit is generated, the threshold determination unit 220 compares "110" from the MSB to the third bit of the threshold $D_{th}$ to "111" from the MSB to the third bit of the digital signal $D_{out}$. Since "110" ("6" in decimal) is less than "111" ("7" in decimal), the threshold determination unit 220 generates the determination result DEC indicating "<."

[Configuration Example of Control Circuit]

Figure 5:
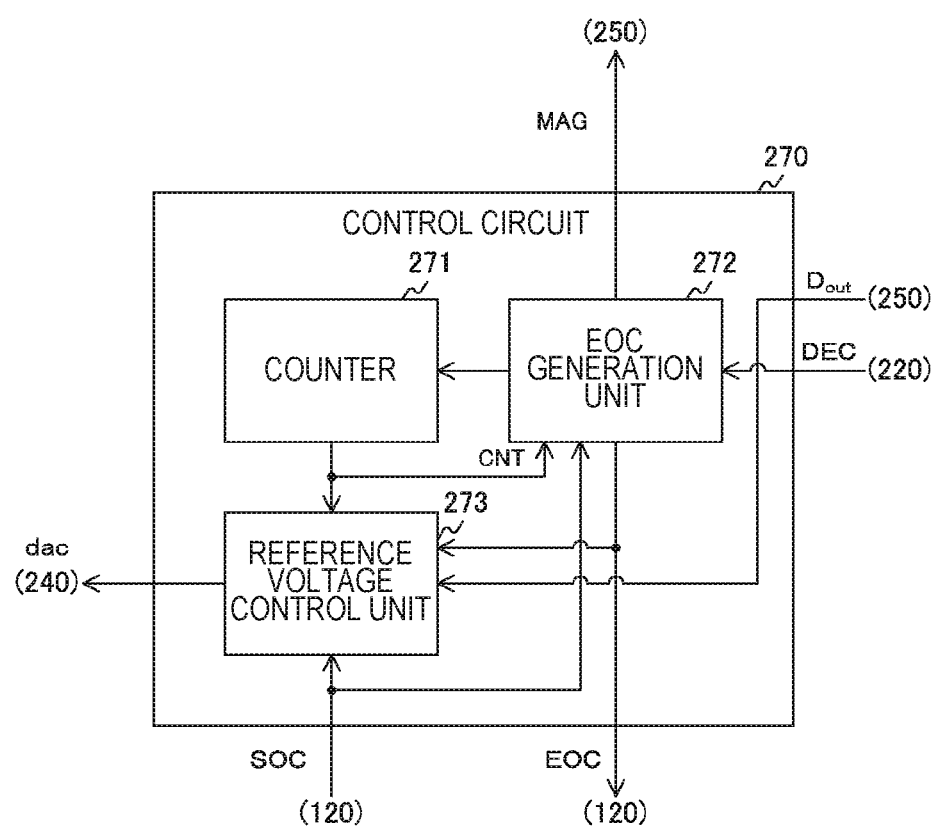
FIG. 5 is a block diagram illustrating a configuration example of a control circuit according to the first embodiment of the present technology.

FIG. 5 is a block diagram illustrating a configuration example of the control circuit 270 according to the first embodiment. The control circuit 270 includes a counter 271, an EOC generation unit 272, and a reference voltage control unit 273.

The counter 271 counts a value from "1" to "N" in a decimal number under the control of the EOC generation unit 272. The counter 271 supplies a count value CNT to the EOC generation unit 272 and the reference voltage control unit 273.

In a case in which the digital signal $D_{out}$ is not within the setting range or a case in which the N-th bit COMP is output, the EOC generation unit 272 generates the end signal EOC and stops the AD conversion. When the start signal SOC is input, the EOC generation unit 272 supplies a reset signal to the counter 271 and initializes the count value CNT to an initial value such as "1."

Then, whenever the determination result DEC is generated, the EOC generation unit 272 shifts an updating target digit in the digit control signal MAG to an upper digit or a lower digit by one digit, controls the counter 271, and counts up the count value CNT.

In addition, the EOC generation unit 272 reads a determination condition indicating whether the threshold is an upper limit or a lower limit from the threshold register 210. Then, in a case in which it is determined that the digital signal $D_{out}$ is outside of the setting range in accordance with the determination result DEC or a case in which the count value CNT exceeds N, the EOC generation unit 272 generates the end signal EOC. The EOC generation unit 272 supplies the end signal EOC to the reference voltage control unit 273 and stops the AD conversion. Note that the EOC generation unit 272 is an example of a stop control unit described in the claims.

The reference voltage control unit 273 changes the reference voltage $V_{ref}$ whenever the count value CNT is updated (that is, the bits COMP are output). When the start signal SOC is input, the reference voltage control unit 273 initializes the reference voltage $V_{ref}$ to an initial value in accordance with the voltage control signal dac. Then, in a case in which a bit corresponding to the updated count value CNT is "1" in the digital signal $D_{out}$, the reference voltage control unit 273 performs control such that a value of −½ of a previous value is added to the reference voltage $V_{ref}$. Conversely, in a case in which a bit corresponding to the count value CNT is "0," the reference voltage control unit 273 performs control such that a value of +½ of the previous value is added to the reference voltage $V_{ref}$. In addition, when the end signal EOC is generated, the reference voltage control unit 273 stops outputting the voltage control signal dac. In this way, the comparator 240 and the reference voltage control unit 273 sequentially generate N bits included in a digital signal of a value corresponding to an analog signal in order. Note that a circuit including the comparator 240 and the reference voltage control unit 273 is an example of a sequential conversion unit described in the claims. In addition, the reference voltage control unit 273 is an example of a reference signal control unit described in the claims.

FIG. 6 is a diagram illustrating an example of an operation of the EOC generation unit 272 according to the first embodiment. In a case in which the start signal SOC is at a high level, the EOC generation unit 272 initializes an internal flag to "0" and initializes the count value CNT to "1." Here, the internal flag is a signal indicating whether the digital signal $D_{out}$ is within the setting range. For example, in a case in which the digital signal $D_{out}$ is within the setting range, "1" is set in the internal flag. Otherwise, "0" is set in the internal flag.

In a case in which the determination result DEC is "11" (digital signal =threshold) at the low level of the start signal SOC, the EOC generation unit 272 shifts the updating target digit by one digit and counts up the count value CNT. When the count value CNT is counted up and then the count value CNT exceeds N ("8" or the like), the EOC generation unit 272 generates the end signal EOC. Note that the threshold determination unit 220 outputs "=," "<," or ">" as the determination result DEC, but may output "≥" or "<."

In addition, in a case in which the determination result DEC is "01" (digital signal>threshold) at the low level of the start signal SOC, the EOC generation unit 272 performs the same control as the control of a case in which the determination result DEC is "11" (threshold=digital signal).

In addition, in a case in which the determination result DEC is "10" (digital signal<threshold) at the low level of the start signal SOC, the EOC generation unit 272 shifts the updating target digit by one digit and counts up the count value CNT. Then, the EOC generation unit 272 generates the end signal EOC in a case in which the internal flag is "0" or a case in which the count value CNT is counted up and then the count value CNT exceeds N, the EOC generation unit 272 generates the end signal EOC.

Note that in a case in which the threshold is not the lower limit but the upper limit, the process when the determination result DEC is "01" (digital signal>threshold) and the process when the determination result DEC is "10" (digital signal<threshold) may be switched.

FIGS. 7A, 7B, and 7C are diagrams illustrating an example of a variation in the reference voltage, the bits COMP, and the determination result DEC according to the first embodiment. In the drawing, a is a graph indicating an example of a variation in the reference voltage Vref. In the drawing, the vertical axis of a represents the reference voltage Vref and the horizontal axis represents a time. In the drawing, b is a diagram illustrating an example of a variation in the bits COMP from the comparator 240. In the drawing, c is a diagram illustrating an example of a variation in the determination result DEC from the determination circuit 222.

When the initial value of the reference voltage $V_{ref}$ is set to $V_{FS}/2$, an input range in which the analog-to-digital converter 200 can perform the AD conversion is in the range of 0 to $V_{FS}$. Here, $V_{FS}$ is a predetermined fixed value. The digital signal processing unit 120 can set a part of the input range as a setting range of a processing target. For example, a range from the threshold $D_{th}$ to $V_{FS}$ is provided as the setting range and a digital signal within the range is processed by the digital signal processing unit 120. Conversely, since a digital signal equal to or less than the threshold $D_{th}$ is outside of the setting range, the digital signal is discarded.

Note that the digital signal processing unit 120 sets the lower limit of the setting range as the threshold $D_{th}$, and can also set the upper limit of the setting range as the threshold $D_{th}$. In addition, the digital signal processing unit 120 can also set both the upper limit and the lower limit of the setting range. In this case, the determination circuit 222 may output both a comparison result of the upper limit and the digital signal and a comparison result of the lower limit and the digital signal.

As exemplified in FIG. 7A, a case in which the input voltage Vin lower than the initial value of the reference voltage Vref is sampled is assumed. As exemplified in b of the drawing, the comparator 240 outputs the bits COMP at the high level. A first bit bout1 of the AD conversion data register 250 is updated in accordance with the bits COMP. In addition, as exemplified in c of the drawing, the determination circuit 222 compares the bit bout1 to a bit bth1 corresponding to the threshold Dth and generates the determination result DEC. Here, since the bit bout1 is identical to the bit bth1, the AD conversion continues.

Since the bit $b_{out1}$ is at the high level, the reference voltage control unit 273 adds the value of $-½$ of the previous value ($=V_{FS}/2$) to the reference voltage $V_{ref}$. Thus, the reference voltage $V_{ref}$ is updated to $V_{FS}/4$. Since the updated reference voltage $V_{ref}$ is lower than the input voltage $V_{ref}$, the comparator 240 outputs the bits COMP at the low level. A second bit $b_{out2}$ of the AD conversion data register 250 is updated in accordance with the bits COMP. In addition, the determination circuit 222 compares the bit $b_{out2}$ to the bit $b_{th2}$ corresponding to the threshold $D_{th}$ and generates the determination result DEC.

Since the bit $b_{out2}$ is at the low level, the reference voltage control unit 273 adds the value of $+½$ of the previous value ($=V_{FS}/4$) to the reference voltage $V_{ref}$. Thus, the reference voltage $V_{ref}$ is updated to $3V_{FS}/8$. Since the updated reference voltage $V_{ref}$ is equal to or greater than the input voltage $V_{ref}$, the comparator 240 outputs the bits COMP at the high level. A third bit $b_{out3}$ of the AD conversion data register 250 is updated in accordance with the bits COMP. In addition, the determination circuit 222 compares the bit $b_{out3}$ to a bit $b_{th3}$ corresponding to the threshold $D_{th}$ and generates the determination result DEC.

The fourth bit $b_{out4}$ of the AD conversion data register 250 is updated in a similar order. Here, a fourth bit $b_{out4}$ of the digital signal $D_{out}$ is less than a bit $b_{th4}$ of the threshold $D_{th}$, the digital signal $D_{out}$ is set outside of the setting range. Therefore, subsequent AD conversion is stopped. In this way, when it is determined that the digital signal $D_{out}$ is outside of the setting range, the analog-to-digital converter 200 stops the AD conversion even before generation of the end bit.

Figure 8:
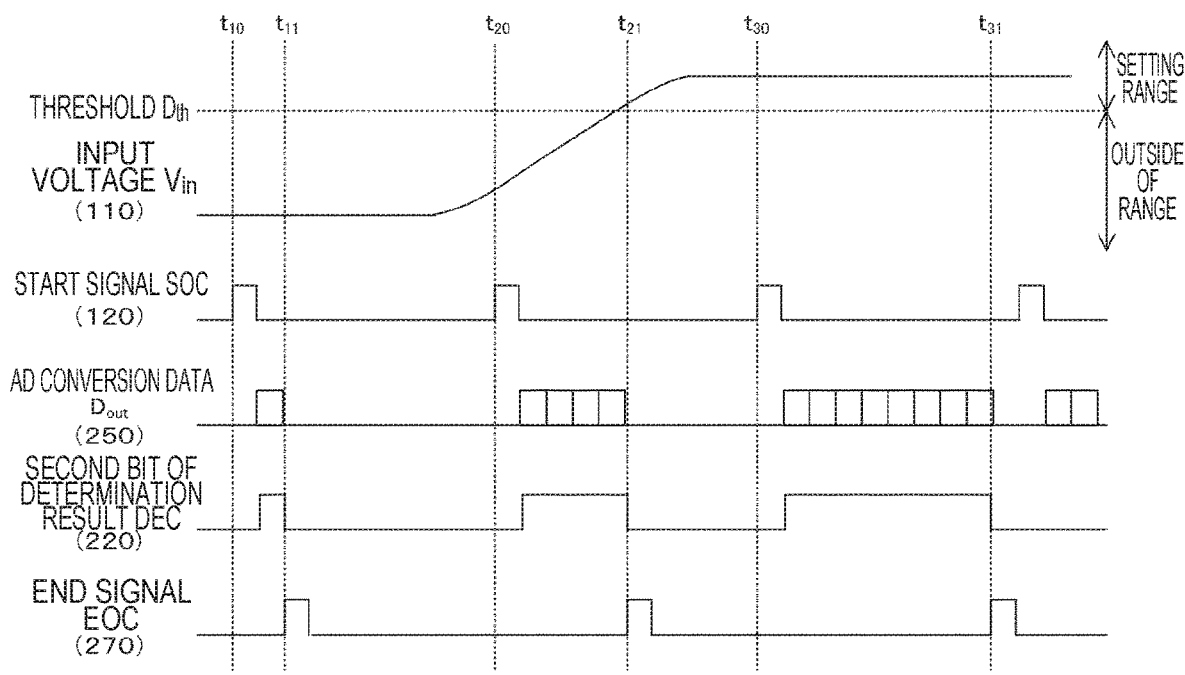
FIG. 8 is a timing chart illustrating an example of an operation of the analog-to-digital converter according to the first embodiment of the present technology.

FIG. 8 is a timing chart illustrating an example of an operation of the analog-to-digital converter according to the first embodiment. When the start signal SOC is input at a timing $t_{10}$, the AD conversion data register 250 updates the first bit of the digital signal $D_{out}$. The threshold determination unit 220 compares the first bit of the digital signal $D_{out}$ to the first bit of the threshold $D_{th}$ and sets the second bit of the determination result DEC to the low level. The setting of the second bit of the determination result DEC to the low level indicates that the digital signal $D_{out}$ is outside of the setting range.

Since the digital signal $D_{out}$ is outside of the setting range, the control circuit 270 generates the end signal EOC and stops the AD conversion at timing $t_{11}$.

When the start signal SOC is input again at timing $t_{20}$ at which a sampling period has passed from timing $t_{10}$, the AD conversion data register 250 updates the first bit of the digital signal $D_{out}$. The threshold determination unit 220 compares the first bit of the digital signal $D_{out}$ to the first bit of the threshold $D_{th}$ and sets the second bit of the determination result DEC to the high level (the digital signal $D_{out}$ is within the setting range). Thereafter, the second, third, and fourth bits of the AD conversion data register 250 are updated in order. Then, the threshold determination unit 220 compares the fourth bit of the digital signal $D_{out}$ to the fourth bit of the threshold $D_{th}$ and sets the second bit of the determination result DEC to the low level (the digital signal $D_{out}$ is outside of the setting range).

Since the digital signal $D_{out}$ is outside of the setting range, the control circuit 270 generates the end signal EOC and stops the AD conversion at timing $t_{21}$.

Then, at timing $t_{30}$ at which the sampling period has passed from timing $t_{20}$, the input voltage $V_{in}$ within the setting range is assumed to be input. In this case, the first to eighth bits of the AD conversion data register 250 are updated in order. At timing $t_{31}$ after all the bits are updated, the control circuit 270 generates the end signal EOC and stops the AD conversion.

Figure 9:
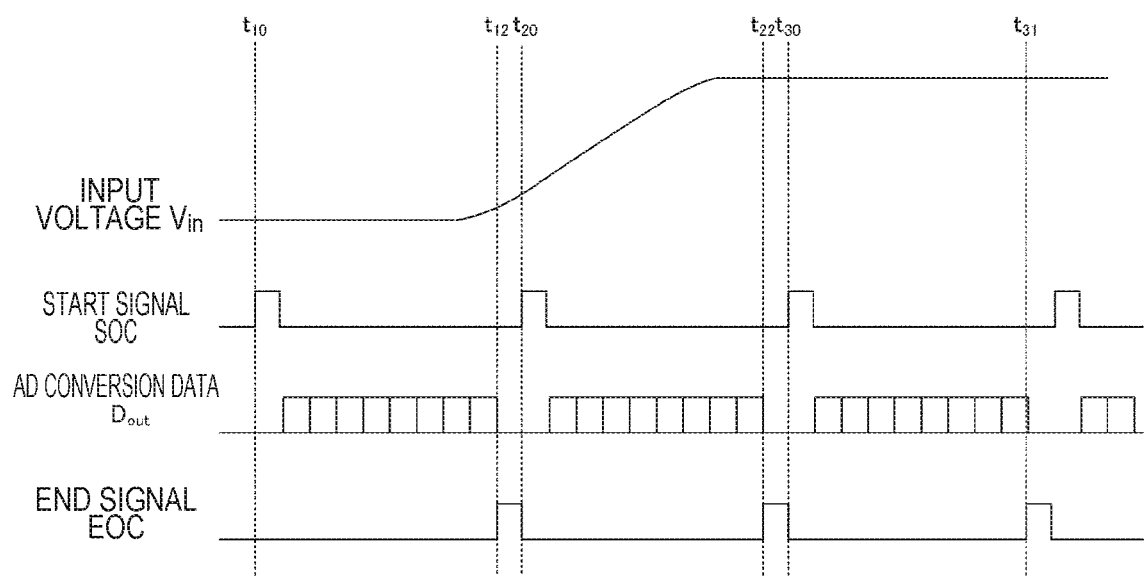
FIG. 9 is a timing chart illustrating an example of an operation of an analog-to-digital converter according to a comparison example.

FIG. 9 is a timing chart illustrating an example of an operation of an analog-to-digital converter according to a comparison example. In the comparison example, no setting range is set and the analog-to-digital converter is assumed to continue the AD conversion up to the end bit is output.

When the start signal SOC is input at timing $t_{10}$, the analog-to-digital converter generates all the bits of the digital signal in order. Thereafter, similarly, whenever the start signal SOC is input, the analog-to-digital converter generates all the bits of the digital signal in order irrespective of the value of the input voltage $V_{in}$.

In this way, in the comparison example, the AD conversion is not stopped within the sampling period up to all the bits of the digital signal are generated. As exemplified in FIG. 9, however, the analog-to-digital converter 200 stops the AD conversion even before generation of all the bits at a time point at which it is determined that the digital signal $D_{out}$ is outside of the setting range. Therefore, compared to the comparison example, an operation time of the analog-to-digital converter 200 is shortened, and thus it is possible to reduce power consumption.

[Operation Example of Analog-to-Digital Converter]

FIG. 10 is a flowchart illustrating an example of an operation of the analog-to-digital converter 200 according to the first embodiment. This operation starts when the start signal SOC is input. The analog-to-digital converter 200 initializes the reference voltage to the initial value. In addition, an initial value of "1" is set to a variable n (step S901).

The analog-to-digital converter 200 compares the input voltage to the reference voltage and generates an n-th bit $b_{outn}$ of the digital signal $D_{out}$ (step S902). Then, the analog-to-digital converter 200 compares the MSB to n-th bits of the digital signal $D_{out}$ to the MSB to n-th bit $b_{thn}$, of the threshold $D_{th}$ and determines whether the value of the digital signal exceeds the threshold (step S903). In a case in which the value of the digital signal is equal to or less than the threshold (No in S903), the analog-to-digital converter 200 increases n and updates the reference voltage based on the n-th bit $b_{outn}$ (step S904).

The analog-to-digital converter 200 determines whether n is greater than "8" (step S905). In a case in which n is equal to or less than "8" (No in step S905), the analog-to-digital converter 200 repeatedly performs the processes subsequent to step S902. In a case in which the value of the digital signal exceeds the threshold (Yes in S903) or a case in which n is greater than "8" (Yes in S905), the analog-to-digital converter 200 generates the end signal EOC and ends the AD conversion.

FIGS. 11A, 11B, 11C, and 11D are explanatory diagrams illustrating an operation in a case in which AD conversion is performed halfway according to the first embodiment. Here, the threshold Dth of the lower limit of the setting range is assumed to a value of "199" in a decimal number. As exemplified in a of the drawing, "11000111" which is a binary number of the threshold Dth is held in the threshold register 210.

When the start signal SOC is input, as exemplified in FIG. 12B, the AD conversion data register 250 is initialized to, for example, "00000000." Then, through comparison between the input voltage and the reference voltage, the first bit bout1 of the AD conversion data register 250 is assumed to be updated to "1," as exemplified in c of the drawing. The first bit bout1 is equivalent to the bit of the most significant digit in the digital signal Dout of a binary number with 8 digits. Since the most significant digit is "1," the value of the digital signal Dout is equal to or greater than "128" in a decimal number. Here, since bits subsequent to the second bit have not yet been generated in c of the drawing, it is unclear whether the value of the digital signal Dout at this time point exceeds a threshold of "199." The analog-to-digital converter 200 compares the first bit bout1 to the first bit bth1 of the threshold Dth, determines that the first bit bout1 is identical to the first bit bth1, and continues the AD conversion.

Figure 11A:
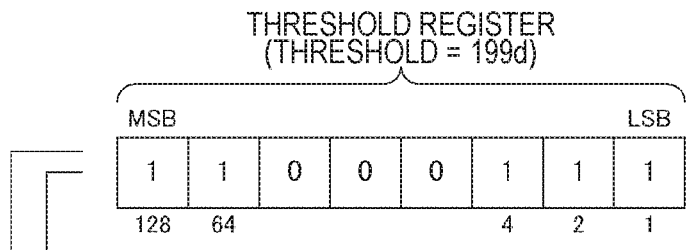
FIGS. 11A, 11B, 11C, and 11D are explanatory diagrams illustrating an operation in a case in which AD conversion is performed halfway according to the first embodiment of the present technology.
Figure 11B:
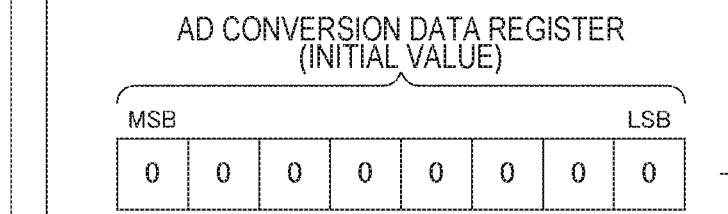
Figure 11C:
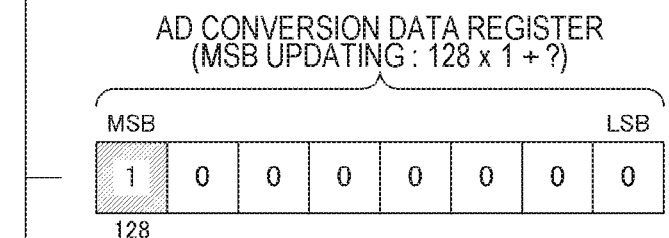
Figure 11D:
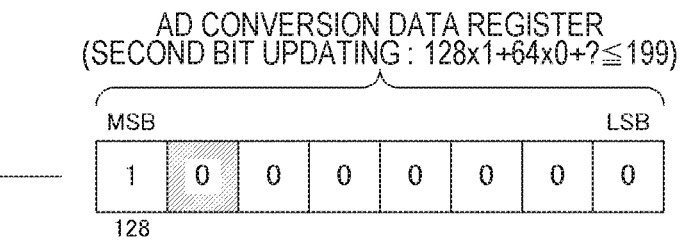

Then, as exemplified in FIG. 11D, through comparison between the input voltage and the updated reference voltage, the second bit bout2 of the AD conversion data register 250 is assumed to be updated to "0." The second bit bout2 is equivalent to a second largest digit in the digital signal Dout. Since the most significant digit is "1" and the subsequent digit is "0," the value of the digital signal Dout is a value equal to or less than "128+63" (=191) in a decimal number. At this point, it is confirmed that the value of the digital signal Dout is equal to or less than the threshold "199." The analog-to-digital converter 200 compares bits up to the second bit bout2 of the digital signal Dout to bits up to the second bit bth2 of the threshold Dth and determines that bout2 is less. Based on a determination result, the analog-to-digital converter 200 generates the end signal EOC and ends the AD conversion. In this way, the analog-to-digital converter 200 stops the AD conversion at a time point at which it is determined that the value of the digital signal Dout is outside of the setting range (for example, equal to or less than the threshold). Therefore, irrespective of whether the value of the digital signal Dout is outside of the setting range, power consumption of the analog-to-digital converter 200 can be further reduced than a case in which the AD conversion continues up to the end bit.

FIGS. 12A, 12B, 12C, 12D, and 12E are explanatory diagrams illustrating an operation in a case in which AD conversion is performed up to the end bit of a signal outside of a setting range according to the first embodiment. As exemplified in a of the drawing, "11000111" is held in the threshold register 210. As exemplified in b of the drawing, the AD conversion data register 250 is assumed to be initialized to "00000000."

Additionally, as exemplified in FIG. 12C, the first bit bout1 of the AD conversion data register 250 is assumed to be updated to "1." As exemplified in d of the drawing, the second bit bout2 is assumed to be updated to "1." The analog-to-digital converter 200 compares bits up to the second bit bout2 of the digital signal Dout to bits up to the second bit bth2 of the threshold Dth, determines that these bits are identical to each other, and continues the AD conversion without generating the end signal EOC. Hereinafter, similarly, it is assumed that bits corresponding to the digital signal up to the seventh bit and the threshold are identical to each other and the AD conversion continues.

Subsequently, as exemplified in FIG. 12E, the end bit bout8 of the AD conversion data register 250 is assumed to be updated to "0." The analog-to-digital converter 200 compares bits up to the end bit bout8 of the digital signal Dout to bits up to the end bit bth8 of the threshold Dth, determines that bout8 is less, and generates the end signal EOC. In this way, in a case in which an input voltage with a value considerably close to the threshold is input, it is not confirmed whether the value exceeds the threshold up to the bit reaches the end bit.

FIGS. 13A, 13B, 13C, 13D, and 13E are explanatory diagrams illustrating an operation in a case in which AD conversion is performed up to the end bit of a signal within the setting range according to the first embodiment. As exemplified in a of the drawing, "11000111" is held in the threshold register 210. As exemplified in b of the drawing, the AD conversion data register 250 is assumed to be initialized to "00000000."

Additionally, as exemplified in FIG. 13C, the first bit bout1 of the AD conversion data register 250 is assumed to be updated to "1." The analog-to-digital converter 200 compares the first bit bout1 to the first bit bth1 of the threshold Dth, determines that these bits are identical to each other, and continues the AD conversion without generating the end signal EOC. Hereinafter, similarly, it is assumed that bits corresponding to the digital signal up to the third bit and the threshold are identical to each other and the AD conversion continues.

Subsequently, as exemplified in FIG. 13D, the fourth bit bout4 of the AD conversion data register 250 is assumed to be updated to "1." Since the most significant bit is "1", the subsequent digit is "1," the third digit is "0," and the fourth digit is "1," the value of the digital signal Dout is a value equal to or greater than "128+64+16" (=208) in a decimal number. At this time point, it is confirmed that the value of the digital signal Dout exceeds the threshold of "199." The analog-to-digital converter 200 compares bits up to the fourth bit bout4 of the digital signal Dout to bits up to the fourth bit bth4 of the threshold Dth and determines that bout2 is greater. Based on a determination result, the analog-to-digital converter 200 continues the AD conversion up to the end bit. In this way, the analog-to-digital converter 200 continues the AD conversion up to the end bit in a case in which the value of the digital signal Dout is within the setting range (for example, exceeds the threshold).

In this way, according to the first embodiment of the present technology, the analog-to-digital converter stops generation of the bits in a case in which the value of the digital signal is not within the predetermined setting range. Therefore, when the digital signal is outside of the setting range, the AD conversion can be stopped halfway. Thus, irrespective of whether the digital signal is within the setting range, power consumption of the analog-to-digital converter can be further reduced than a case in which the AD conversion continues.

<2. Second Embodiment>

In the above-described first embodiment, the analog-to-digital converter 200 outputs the digital signal $D_{out}$ generated by converting the analog signal. However, as the number of bits of the digital signal $D_{out}$ is larger, there is a concern of power consumption of an interface transmitting the digital signal $D_{out}$ increasing. From the viewpoint of reducing the power consumption, the determination result DEC can also be output instead without outputting the digital signal $D_{out}$. The analog-to-digital converter 200 according to a second embodiment is different from that of the first embodiment in that the determination result DEC is output instead of the digital signal $D_{out}$.

Figure 14:
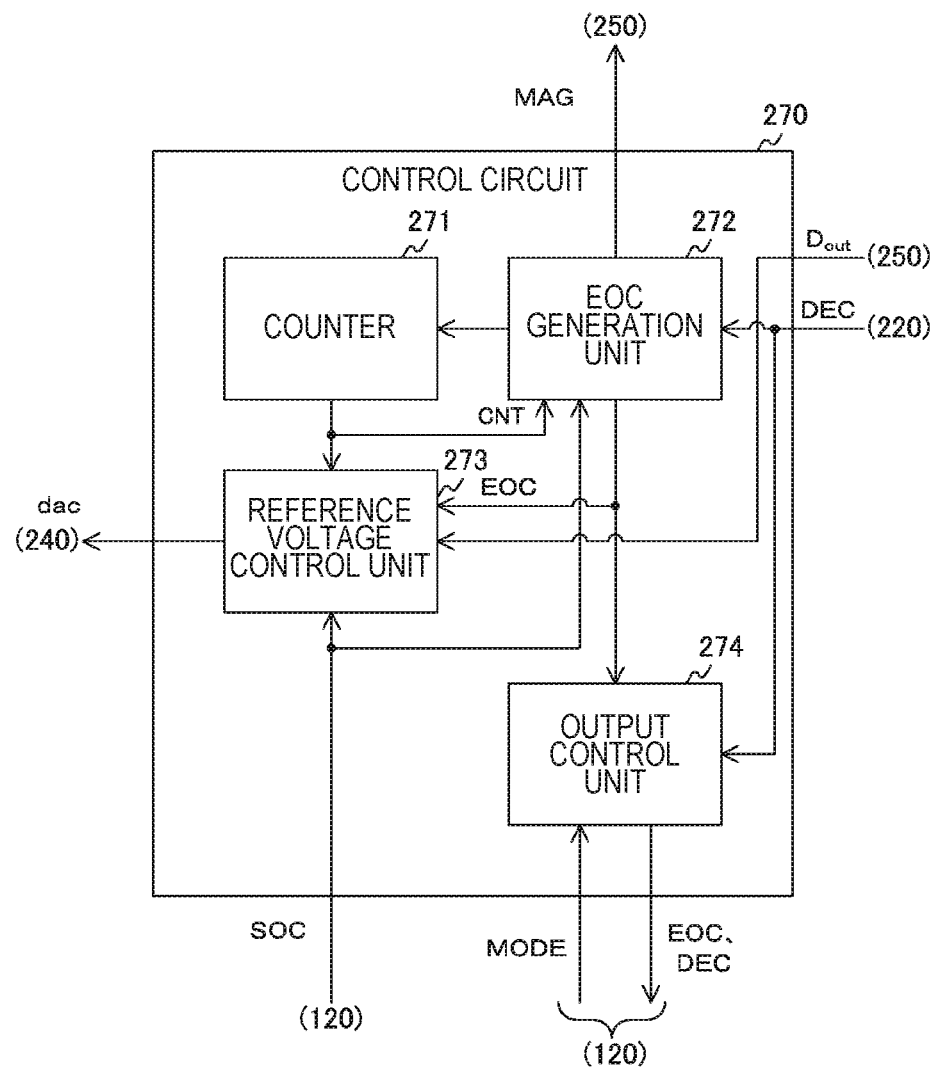
FIG. 14 is a block diagram illustrating a configuration example of a control circuit according to a second embodiment of the present technology.

FIG. 14 is a block diagram illustrating a configuration example of a control circuit 270 according to the second embodiment. The control circuit 270 according to the second embodiment is different from that of the first embodiment in that an output control unit 274 is further included. In addition, the AD conversion data register 250 according to the second embodiment supplies the digital signal $D_{out}$ to only the threshold determination unit 220 and the control circuit 270 without supplying the digital signal $D_{out}$ to the digital signal processing unit 120.

The output control unit 274 outputs the end signal EOC and the determination result DEC when the AD conversion stops. A mode signal MODE generated by the digital signal processing unit 120 or the like is input to the output control unit 274. The mode signal MODE indicates whether the analog-to-digital converter 200 is in a condition determination output mode or a determination result output mode. The condition determination output mode is a mode in which the determination result DEC is output along with the end signal EOC in a case in which the digital signal $D_{out}$ is within the setting range. On the other hand, the determination result output mode is a mode in which the determination result DEC is output along with the end signal EOC irrespective of whether the digital signal $D_{out}$ is within the setting range. For example, in the case of the condition determination output mode, a logical value "1" is set in the mode signal MODE. In the case of the determination result output mode, a logical value "0" is set. The output control unit 274 outputs the end signal EOC and the determination result DEC, as necessary, in accordance with the mode signal MODE.

FIG. 15 is a diagram illustrating an example of an operation of the output control unit 274 according to the second embodiment. In a case in which the mode signal MODE is "1" (the condition determination output mode), the output control unit 274 determines whether the digital signal $D_{out}$ is within the setting range whenever a bit $b_{outn}$ of each digit is generated. Then, the output control unit 274 outputs the determination result DEC along with the end signal EOC at the time of end of the AD conversion in a case in which the digital signal $D_{out}$ is within the setting range. Conversely, when the digital signal $D_{out}$ is outside of the setting range, the output control unit 274 stops the AD conversion, but does not output both the end signal EOC and the determination result DEC.

Conversely, when the mode signal MODE is "0" (the determination result output mode), the output control unit 274 outputs the end signal EOC and the determination result DEC at the time of the end of the AD conversion irrespective of whether the digital signal $D_{out}$ is within the setting range.

Note that a normal mode in which the digital signal $D_{out}$ is output and the determination result DEC is not output, as in the first embodiment, may be further provided in addition to the condition determination output mode and the determination result output mode. In addition, one of the condition determination output mode and the determination result output mode and the normal mode may be provided.

Figure 16:
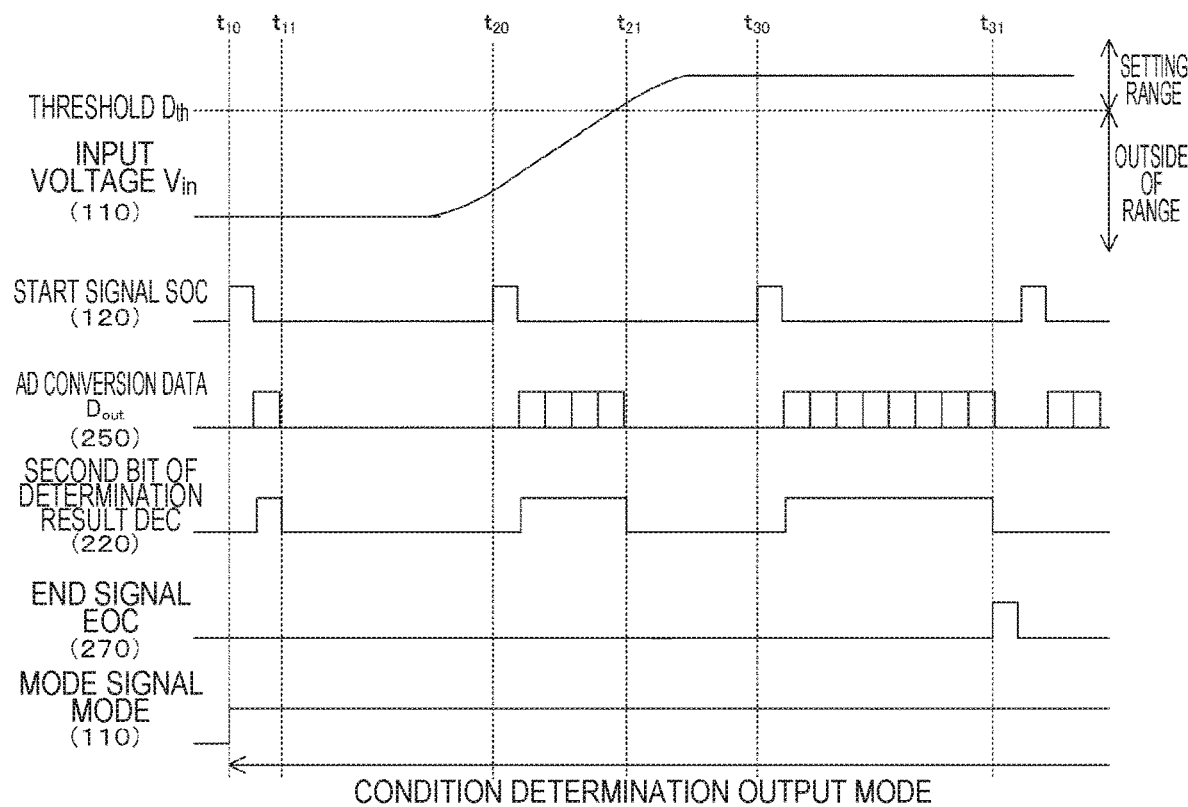
FIG. 16 is a timing chart illustrating an example of an operation of an analog-to-digital converter according to the second embodiment of the present technology.

FIG. 16 is a timing chart illustrating an example of an operation of an analog-to-digital converter according to the second embodiment. At timing $t_{10}$, the condition determination output mode is assumed to be set. In this mode, since the digital signal $D_{out}$ is outside of the setting range, the control circuit 270 stops the AD conversion without outputting the end signal EOC to the digital signal processing unit 120 at timing $t_{11}$.

Conversely, in a case in which it is determined that the digital signal $D_{out}$ is within the setting range, the control circuit 270 outputs the end signal EOC and the determination result DEC and stops the AD conversion at timing $t_{31}$ after updating of all the bits. As described above, by outputting the end signal EOC or the like only when the digital signal $D_{out}$ is within the setting range, it is possible to further reduce power consumption of an interface than a case in which the end signal EOC is output irrespective of whether the digital signal $D_{out}$ is within the setting range.

In this way, according to the second embodiment of the present technology, the analog-to-digital converter 200 can further reduce power consumption of an interface than the case in which the digital signal is output since the determination result DEC is output instead of the digital signal $D_{out}$.

<3. Third Embodiment>

In the above-described first embodiment, the threshold register 210 and the threshold determination unit 220 are provided in the analog-to-digital converter 200. However, there is a concern of a circuit scale of the analog-to-digital converter 200 increasing, compared to a case in which threshold register 210 and the threshold determination unit 220 are not provided. The analog-to-digital converter 200 according to the third embodiment is different from that of the first embodiment in that the increase in the circuit scale is suppressed.

Figure 17:
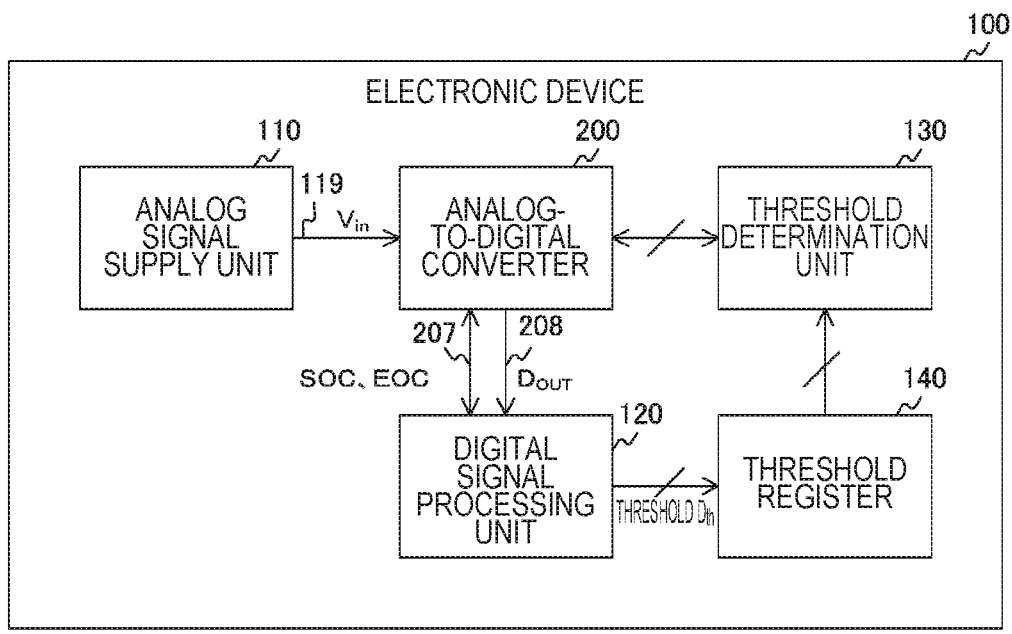
FIG. 17 is a block diagram illustrating a configuration example of an electronic device according to a third embodiment of the present technology.

FIG. 17 is a block diagram illustrating a configuration example of an electronic device 100 according to the third embodiment. The electronic device 100 according to the third embodiment is different from that of the first embodiment in that the threshold determination unit 130 and the threshold register 140 are provided outside the analog-to-digital converter 200. The configurations of the threshold determination unit 130 and the threshold register 140 are the same as those of the threshold determination unit 220 and the threshold register 210 according to the first embodiment.

Figure 18:
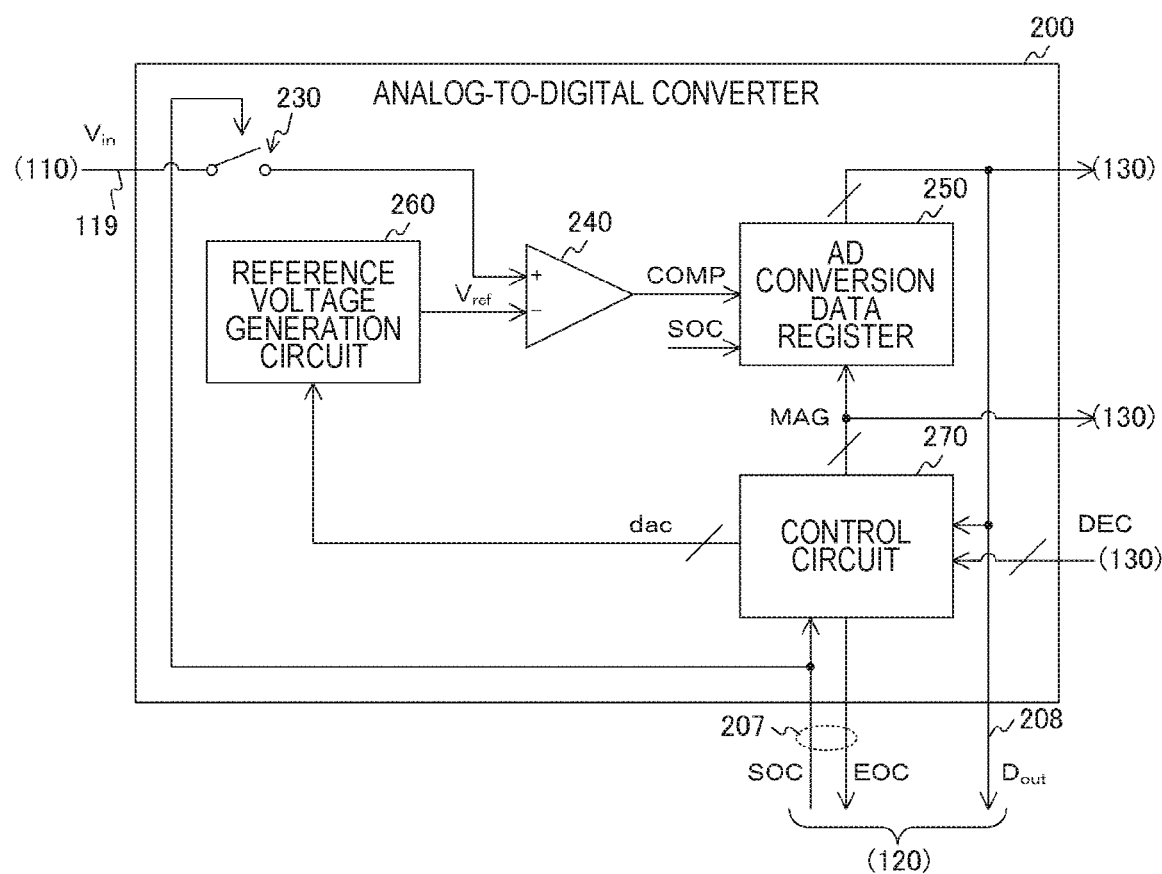
FIG. 18 is a block diagram illustrating a configuration example of an analog-to-digital.

FIG. 18 is a block diagram illustrating a configuration example of the analog-to-digital converter 200 according to the third embodiment. The analog-to-digital converter 200 according to the third embodiment is different from that of the first embodiment in that the threshold register 220 and the threshold determination unit 210 are not provided.

In this way, according to the third embodiment of the present technology, it is possible to reduce the circuit scale of the analog-to-digital converter 200 since the threshold determination unit 130 and the threshold register 140 are provided outside the analog-to-digital converter 200.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a compact disc (CD), a minidisc (MD), and a digital versatile disc (DVD), a memory card, a Blu-ray disc (registered trademark), a hard disc drive (HDD), and a solid state drive (SSD) can be used.

Note that the effects described in the present specification are not necessarily limited, and any effect described in the present disclosure may be exhibited.

Additionally, the present technology may also be configured as below.

(1)

An analog-to-digital converter including:

a sequential conversion unit configured to sequentially generate a predetermined number of bits of a value corresponding to an analog signal when the analog signal is input;

a determination unit configured to determine whether a value of a digital signal including the predetermined number of bits is within a predetermined range whenever the bits are generated; and a stop control unit configured to stop the sequential conversion unit in a case in which the value of the digital signal is not within the predetermined range.

(2)

The analog-to-digital converter according to (1), in which the sequential conversion unit includes a comparator configured to compare the analog signal to a reference signal and generate the bits on a basis of a result of the comparison, and a reference signal control unit configured to update a value of the reference signal whenever the bits are generated.

(3)

The analog-to-digital converter according to (1) or (2), further including:

an output control unit configured to output a determination result obtained by determining whether the value of the digital signal is within the predetermined range.

(4)

The analog-to-digital converter according to (3), in which the output control unit outputs the determination result in a case in which the value of the digital signal is within the predetermined range.

(5)

The analog-to-digital converter according to any one of (1) to (4), further including:

a threshold holding unit configured to hold a threshold of a binary number indicating a boundary of the predetermined range.

in which the determination unit determines whether the value of the digital signal is within the predetermined range on a basis of the threshold.

(6)

The analog-to-digital converter according to (5), in which the determination unit compares a value up to digits corresponding to the generated bits of the threshold to a value up to the generated bits of the digital signal.

(7)

The analog-to-digital converter according to any one of (1) to (6), in which the stop control unit generates a predetermined end signal in a case in which the value of the digital signal is not within the predetermined range or a case in which the predetermined number of bits are output, and the reference signal control unit stops a process of changing a value of the reference signal in accordance with the predetermined end signal.

(8)

An electronic device including:

a sequential conversion unit configured to sequentially generate a predetermined number of bits of a value corresponding to an analog signal when the analog signal is input;

a determination unit configured to determine whether a value of a digital signal including the predetermined number of bits is within a predetermined range whenever the bits are generated;

a stop control unit configured to stop the sequential conversion unit in a case in which the value of the digital signal is not within the predetermined range; and a digital signal processing unit configured to process the digital signal.

(9)

A method of controlling an analog-to-digital converter, the method including:

a sequential conversion procedure of sequentially generating a predetermined number of bits of a value corresponding to an analog signal when the analog signal is input;

a determination procedure of determining whether a value of a digital signal including the predetermined number of bits is within a predetermined range whenever the bits are generated; and a stop control procedure of stopping the sequential conversion unit in a case in which the value of the digital signal is not within the predetermined range.

REFERENCE SIGNS LIST

100 electronic device
110 analog signal supply unit
120 digital signal processing unit
130, 220 threshold determination unit
140, 210 threshold register
200 analog-to-digital converter
221, 223 selector
222 determination circuit
230 sampling switch
240 comparator
250 AD conversion data register
260 reference voltage generation circuit
270 control circuit 271 counter
272 EOC generation unit
273 reference voltage control unit
274 output control unit

The invention claimed is:

1. An analog-to-digital converter, comprising:
   a sequential conversion unit configured to sequentially generate a determined number of bits of a value corresponding to an input analog signal;
   a determination unit configured to determine whether a value of a digital signal including the determined number of bits is within a range whenever the determined number of bits are generated; and
   a stop control unit configured to stop the sequential conversion unit based on the value of the digital signal that is outside the range.

2. The analog-to-digital converter according to claim 1, wherein the sequential conversion unit includes:
   a comparator configured to:
      compare the input analog signal to a reference signal; and
      generate the determined number of bits based on a result of the comparison; and
   a reference signal control unit configured to update a value of the reference signal whenever the determined number of bits are generated.

3. The analog-to-digital converter according to claim 1, further comprising:
   an output control unit configured to output a determination result obtained based on the determination whether the value of the digital signal is within the range.

4. The analog-to-digital converter according to claim 3, wherein the output control unit is further configured to output the determination result based on the value of the digital signal that is within the range.

5. The analog-to-digital converter according to claim 1, further comprising
   a threshold holding unit configured to hold a threshold of a binary number, wherein
   the threshold indicates a boundary of the range, and
   the determination unit is further configured to determine whether the value of the digital signal is within the range based on the threshold.

6. The analog-to-digital converter according to claim 5, wherein the determination unit is further configured to compare a value up to digits corresponding to the generated determined number of bits of the threshold to a value up to the generated determined number of bits of the digital signal.

7. The analog-to-digital converter according to claim 2, wherein
   the stop control unit is further configured to generate an end signal based on one of the value of the digital signal that is outside the range or output of the determined number of bits, and
   the reference signal control unit is further configured to stop change of the value of the reference signal based on the end signal.

8. An electronic device, comprising:
   a sequential conversion unit configured to sequentially generate a determined number of bits of a value corresponding to an input analog signal;
   a determination unit configured to determine whether a value of a digital signal including the determined number of bits is within a range whenever the determined number of bits are generated;
   a stop control unit configured to stop the sequential conversion unit based on the value of the digital signal that is outside the range; and
   a digital signal processing unit configured to process the digital signal.

9. A method of controlling an analog-to-digital converter, the method comprising:
   sequentially generating a determined number of bits of a value corresponding to an input analog signal;
   determining whether a value of a digital signal including the determined number of bits is within a range whenever the determined number of bits are generated; and
   stopping the sequential generation of the determined number of bits based on the value of the digital signal that is outside the range.

* * * * *